United States Patent [19]

Kawabe

[11] Patent Number: 5,786,989
[45] Date of Patent: Jul. 28, 1998

[54] PRINTED CIRCUIT BOARD MOUNTING STRUCTURE AND ELECTRONIC DEVICE USING THE SAME

[75] Inventor: Shin Kawabe, Tokyo, Japan

[73] Assignee: Mitsubishi Denki Kabushiki Kaisha, Tokyo, Japan

[21] Appl. No.: 591,908

[22] Filed: Jan. 25, 1996

[30] Foreign Application Priority Data

Feb. 17, 1995 [JP] Japan ................ 7-029544

[51] Int. Cl.⁶ .............. H05K 5/00; H01R 9/18
[52] U.S. Cl. ............ 361/759; 174/138 G; 174/165; 361/758; 361/773
[58] Field of Search .............. 174/138 G, 164, 174/165, 166; 361/732, 725, 740, 742, 747, 758, 759, 801, 804, 807, 809, 825, 773; 403/118, 256, 257, 296; 411/167, 176; 439/65, 82, 83, 75

[56] References Cited

U.S. PATENT DOCUMENTS

| | | | |
|---|---|---|---|
| 3,382,414 | 5/1968 | Borner | 361/725 |
| 4,158,877 | 6/1979 | Peterson | 361/803 |
| 5,008,777 | 4/1991 | Burns | 361/742 |

FOREIGN PATENT DOCUMENTS

| | | | |
|---|---|---|---|
| 2900838 | 7/1980 | Germany | 361/803 |
| 60-183796 | 9/1985 | Japan | 361/753 |
| 80-183796 | 9/1985 | Japan . | |
| 63-283093 | 11/1988 | Japan | 439/75 |

*Primary Examiner*—Donald Sparks
*Attorney, Agent, or Firm*—Wolf, Greenfield & Sacks, P.C.

[57] ABSTRACT

A mounting structure for mounting a printed circuit board on a frame of an electronic device. The mounting structure comprises a body, a lead, and a threaded portion. The threaded portion is formed on the body, and receives a screw. The printed circuit board is secured to a frame of an electronic device using the mounting structure. Specifically, the mounting structure is secured to the frame using the screw. The lead is soldered to lands on a mounting surface of the printed circuit board by a process for mounting electronic parts (e.g. an IC or LSI package) on the mounting surface of the electronic device.

22 Claims, 8 Drawing Sheets

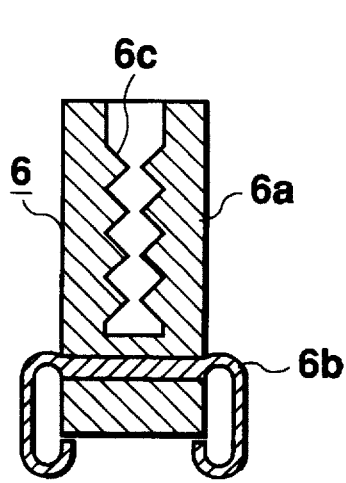
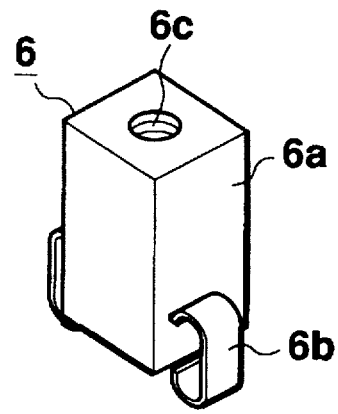
Fig. 1A  Fig. 1B
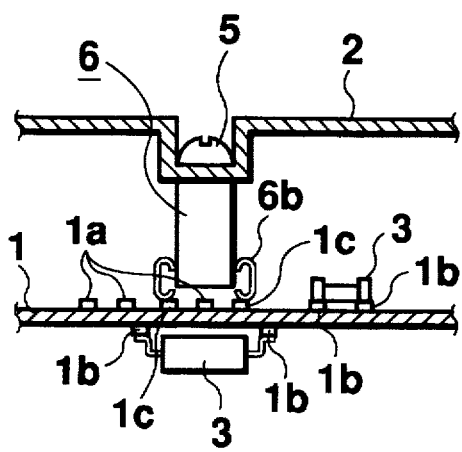
Fig. 1C

PRINTED CIRCUIT BOARD MOUNTING STRUCTURE AND ELECTRONIC DEVICE USING THE SAME

BACKGROUND OF THE INVENTION

1. Field of the Invention

This invention relates to a printed circuit board mounting structure and an electronic device in which printed circuit boards are mounted using the mounting structures, and more particularly to a structure for mounting printed circuit boards in a frame of an electronic device and an electronic device including printed circuit boards mounted using the mounting structures.

2. Description of the Prior Art

Japanese Patent Laid-Open Publication No. Sho 60-183, 796 shows an example of printed circuit board mounting structures of the prior art in FIG. 9 of the accompanying drawings.

Referring to FIG. 9, a printed circuit board 1 is secured in a frame 2. The printed circuit board 1 includes not only electronic parts 3 such as an IC package, an LSI package, resistance elements and capacitance elements but also printed circuit patterns (wiring and electrode terminal patterns) 1a on front and rear surfaces thereof. Further, when it is of a multiple layer circuit pattern type, the printed circuit board 1 has printed circuit board patterns 1a formed on the front and rear surfaces thereof and in an inner portion thereof. The printed circuit board patterns 1a are soldered, for electrical connection, to the electronic parts 3 via lands (electrode terminals) 1b which are a part of the printed circuit board patterns 1a.

The printed circuit board 1 has a through-hole 1h. The frame 2 has a screw hole (not shown) at a position confronting the through-hole 1h. Specifically, the printed circuit board 1 is secured to the frame 2 by a screw 5 which is inserted into the screw hole of the frame 2 via the through-hole 1h.

Usually, the screw 5 has a diameter of approximately 3 mm so as to secure the printed circuit board 1 to the frame 2. The through-hole 1h simply serves to secure the printed circuit board 1 to the frame 2, and has a diameter which is slightly larger than that of the screw 5. Thus, the screw 5 can be smoothly inserted into the through-hole 1h, the diameter of which is usually 3.5 mm to 4.0 mm.

FIG. 10 shows a cross section of a computer digitizer which uses a pen as an input unit and is mounted in a frame 2 by the method described above. The computer digitizer includes a digitizer 9 and a sensor 9a on the front surface of the digitizer 9. The frame 2 is provided with a liquid crystal display (LCD) 10, and a glass cover 11 for protecting the liquid crystal display 10. The digitizer 9 is secured to the frame 2 using screws 5.

The foregoing electronic devices are prone to problems as described below.

(1) When the through-hole 1h is present on the printed circuit board 1, it is necessary to mount the printed circuit patterns 1a and electronic parts 3 thereon at areas except for the through-hole 1h. In other words, a certain space should be prepared around the through-hole 1h such that stress caused by securing the printed circuit board 1 to the frame 2 is not applied to the printed circuit patterns 1a and electronic parts 3. For instance, when the through-hole 1h has a diameter of 4.0 mm, a space whose diameter is approximately 10 mm should be kept around the through-hole 1h. Neither the printed circuit patterns 1a nor the electronic parts 3 should be mounted on this space. Therefore, the printed circuit board patterns 1a should be mounted on the circuit board 1 by rerouting around the through-hole 1h. Further, the electronic parts 3 should be mounted on the foregoing reduced space. This means that the printed circuit board 1 suffers from a reduced packaging density (i.e. a reduced area using efficiency, and that the electronic device cannot be made compact.

(2) Referring to FIG. 10, the computer digitizer includes the digitizer 9 and the liquid crystal display 10. The sensor 9a and liquid crystal display 10 are disposed substantially on the entire surface of the digitizer 9 (i.e. printed circuit board). The sensor 9a functions as the input unit in the ditigizer 9, and has its elements arranged substantially on the entire surface thereof. In other word, the through-hole (1h) cannot be made on the input unit. Therefore, an additional space should be kept on the digitizer 9a so as to make the through-hole 1h. The same holds true for the liquid crystal display 10, i.e. no through-hole can be made at the center thereof, so an additional space should be prepared for the through-hole. Therefore, the additional spaces on the digitizer 9 and the liquid crystal display 10 inevitably enlarge the frame 2, and make it impossible to reduce the size of the input digitizer (electronic device). Further, since no mounting structure can be attached to the centers of the input unit of the digitizer 9 and the liquid crystal display 10, they would be secured with reduced mechanical strength.

SUMMARY OF THE INVENTION

It is an object of the invention to provide a mounting structure for strongly securing a printed circuit board on a frame of an electronic device, with an improved packaging density. Further, the invention is intended to provide a small electronic device in which electronic parts are mounted using the foregoing mounting structure.

According to a first aspect of the invention, there is provided a mounting structure for mounting a printed circuit board on a frame of an electronic device, comprising: a body; a threaded portion formed on a side thereof corresponding to the frame, the threaded portion receiving a screw for securing the body to the frame; and at least one lead disposed on the body at sides corresponding to the printed circuit board, the lead being soldered to lands on a mounting surface of the printed circuit board.

In this arrangement, the lead of the mounting structure is soldered to the lands of the printed circuit board concurrent with the electronic parts. A space for securing the mounting structure can be reduced. Further, the mounting structure can be positioned as desired, and improve a packaging density of the printed circuit board.

The lead may in the shape of a gull wing, and a space is defined between the body of the mounting structure and the mounting surface of the printed circuit board.

This lead is effective in defining a vacant space between the mounting structure and a mounting surface of the printed circuit board. This can also improve the packaging density.

The lead in the shape of the gull wing may be made of a material having a high tensibility, and can alleviate shocks or stresses applied to the printed circuit board. This further improves the reliability of the electronic parts.

The body of the mounting structure is made of a conductive material. The lead is insert-molded in the body. The body is joined, for electrical connection, to the frame or a reference power supply of the frame using a conductive screw inserted into the threaded portion, and the lead is joined to a reference power supply of the printed circuit board for electrical connection therewith.

The conductive body functions to transfer noise generated by a reference power supply of the printed circuit board to the frame or a reference power supply of the frame, where the noise is absorbed. The electronic device is protected against electro magnetic radiation. This arrangement improves the packaging density of the printed circuit board.

The lead may be insert-molded in the body, have a portion exposed in the threaded portion of the body, be partially connected to the frame or a reference power supply of the frame by a conductive screw inserted in the threaded portion, and be connected to a reference power supply of the electronic device.

The exposed portion of the lead is connected to the screw received in the threaded portion. Thus, noise generated by the reference power supply of the printed circuit board can be transferred to the frame or the reference power supply of the frame, and absorbed therein. In other words, the mounting structure can also function as a route for transferring the noise. This can improve the packaging density of the printed circuit board.

The lead may have an extension for connection with the frame or a reference power supply of the frame, and the extension extends between lands of the printed circuit board and the frame or the reference power supply of the frame.

This extension of the lead is effective in absorbing noise, generated by the reference power supply of the printed circuit board, in the frame or the reference power supply of the frame. The extension can be formed by simply modifying the shape of the lead. The arrangement can improve the packaging density of the printed circuit board.

The body may include two members which are used for a connection with the frame and for a connection with the printed circuit board, and can turn respectively via a hinge disposed therebetween.

Since the two members of the body can be relatively turned, the printed circuit board can be secured to the frame of the electronic device at a desired angle.

The lead may be disposed on one side of the body, and the threaded portion is formed from a top of the body to an area near the bottom of the body.

Further, the lead may be disposed on one side of the body, and the threaded portion may be present on a side opposite to the lead.

The lead may be of a surface mounting type, and can improve the packaging density of the printed circuit board.

The lead may be of a pin-insert type, and can be strongly joined to the printed circuit board.

According to a second aspect of the invention, there is provided an electronic device including a printed circuit board mounted on a frame thereof by means of the foregoing mounting structures. The use of the mounting structure is advantageous in reducing a size of the electronic device.

In a third aspect of the invention, there is provided an electronic device including a printed circuit board mounted on a frame thereof using a mounting structure and a pin, wherein the mounting structure includes a body having a pair of notches on sides thereof and at least one lead arranged on other sides of the body, the pin being formed on the frame and being engageable with the notches of the body, and the lead being soldered to lands on a mounting surface of the printed circuit board.

In this electronic device, the lead is soldered to the lands of the printed circuit board. At the notches, the mounting structure is freely engageable with or disengageable from the pin of the frame. This enables the printed circuit board to be attached to or detached from the frame of the electronic device, and facilitates assembly, inspection, maintenance, and repair of the electronic device.

BRIEF DESCRIPTION OF THE DRAWINGS

Embodiments of the invention will now be described, by way of example, with reference to the accompanying drawings in which:

FIG. 1A is a sectional view of a printed circuit board mounting structure (hereinafter called "mounting structure") according to a first embodiment of the invention;

FIG. 1B is a perspective view of the mounting structure of FIG. 1A;

FIG. 1C is a sectional view of a main part of an electronic device using the mounting structure of FIG. 1A;

DETAILED DESCRIPTION OF THE PREFERRED EMBODIMENTS

Figure 2A:
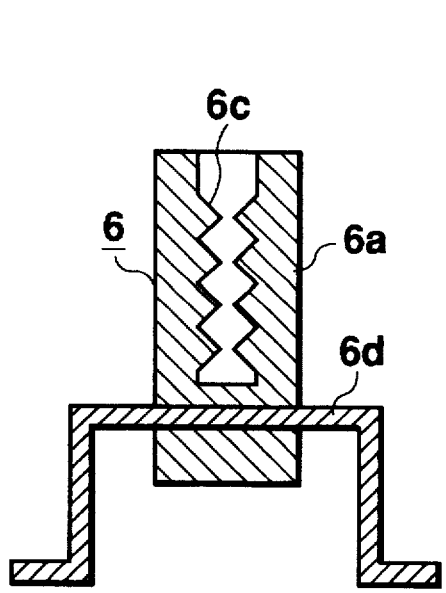
FIG. 2A is a sectional view of a printed circuit board mounting structure according to a second embodiment of the invention.

Embodiment 1:

Referring to FIGS. 1A to 1C, a printed circuit board mounting structure 6 (hereinafter called "mounting structure 6") comprises a body 6a, a lead 6b and a threaded portion 6c.

The body 6a is used to secure a printed circuit board 1 to a frame 2 of an electronic device, and is in the shape of a prism. The body 6a is made of resin which is a material commonly used or semiconductor packages (e.g. IC packages, LSI packages, and so on), and is molded by a transfer mold process.

The lead 6b is insert-molded across a lower part of the body 6b, and has its opposite ends folded in the shape of the letter J. In other words, the lead 6b has a J-bend type surface mounting structure. The lead 6b is made of a conductive material such as an alloy of Fe—Ni, an alloy of Cu, or the like, which is commonly used for leads of a semiconductor package.

The lead 6b is shaped so as to permit soldering similarly to the electronic parts 3. As shown in FIG. 1C, the printed circuit board 1 includes lands 1c which are similar to lands 1b of a printed circuit pattern 1a for mounting the electronic parts 3. Generally, the lands 1c are formed by the same process as that used for the lands 1b. The mounting structure 6 is mounted on the printed circuit board 1 simultaneously with the electronic parts 3.

The threaded portion 6c is a female screw formed in the body 6a from a top thereof. A screw 5 (not shown) is inserted via a through-hole (not shown) on the frame 2 of the electronic device, and is received in the threaded portion 6c of the mounting structure 6.

The mounting structure 6 is advantageous in the following respects.

First of all, the lead 6b of the mounting structure 6 and the lands 1c of the printed circuit board 1 are soldered concurrently with the electronic parts 3. On the other hand, the electronic parts 3 are secured to the frame 2 of the electronic device via the mounting structure 6, by inserting the screw 5 into the threaded portion 6c. This means that the mounting structure 6 can be easily secured to the frame 2 of the electronic device.

Secondly, the printed circuit board 1 is required only to have a vacant space on its front surface whose size is substantially equal to a space for securing the mounting structure 6. This can reduce the space for the mounting structure 6 to be disposed between the frame 2 and the printed circuit board 1. In other words, only a minimum space is necessary to connect the lead 6a and the lands 1c, and can assure a strong joint between the lead 6a and the lands 1c. Thus, it is possible to obviate an additional space around the through-hole 1h compared with the mounting structure of the prior art.

Thirdly, the lands 1c to be joined with the mounting structure 6 are a part of the printed circuit pattern 1a similarly to the lands 1b for mounting the electronic parts 3. The lands 1c can be optionally positioned in accordance with a mounting posture of the electronic parts 3 or a strength of the mounting structure 6. The position of the mounting structure 6 can be relatively easily changed by modifying the printed circuit pattern 1a, compared with when a through-hole 1h is made on the printed circuit board 1.

Fourthly, since no through-hole is required to secure the mounting structure 6, the printed circuit pattern 1a can be formed on the mounting surface of the printed circuit board 1 which is under the mounting structure 6. This can reduce an amount of the lead to be arranged in a meandering manner. When the printed circuit board 1 has a multiple layer wiring pattern, the circuit pattern 1a can be formed inside the printed circuit board 1. Therefore, the printed circuit board 1 can improve its packaging density, which enables the frame 2 and the electronic parts 3 to be downsized.

Fifthly, the mounting structure 6 is formed by a process which is similar to the process for forming the semiconductor package, and is mounted by a process similar to the semiconductor package mounting process. Therefore, no specific processes are required to make and mount the mounting structure 6. Therefore, it is possible to reduce the manufacturing and assembling cost of the mounting structure 6 itself.

Figure 10:
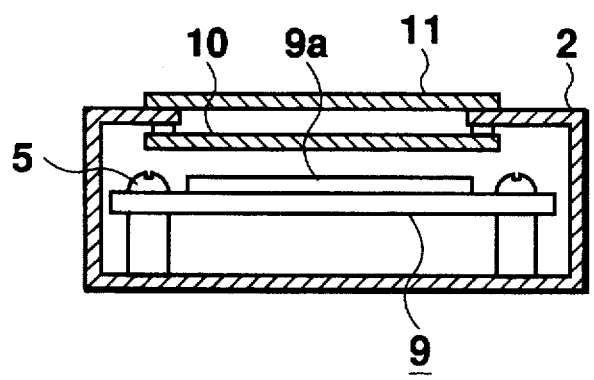
FIG. 10 is a sectional view of a pen input type computer digitizer of the prior art.

Finally, when the mounting structure 6 is applied to the pin-input type computer digitizer shown in FIG. 10, it is not necessary to make through-holes on the digitizer and the liquid crystal display as described above, which enables the mounting structure 6 to be relatively easily arranged at a desired position. Therefore, the mounting structure 6 for the digitizer and other parts can be mechanically strengthened. Further, electronic parts can be more densely packaged, thereby making the pen input digitizer more compact, and reducing the manufacturing cost.

Embodiment 2:

In this embodiment, a lead 6d is in the shape of a gull wing, and differs from the lead 6b of the first embodiment in this respect.

Figure 2B:
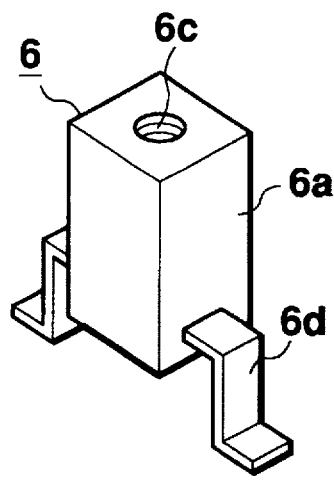
FIG. 2B is a perspective view of the mounting structure of FIG. 2A.
Figure 2C:
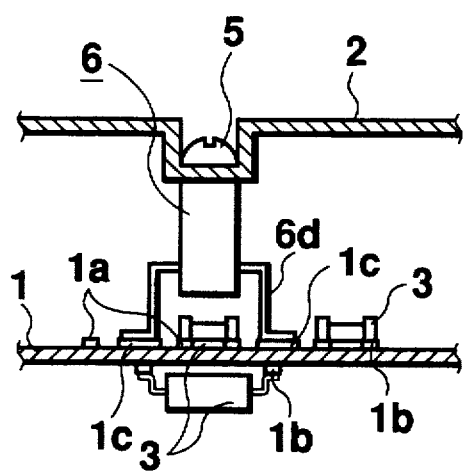
FIG. 2C is a sectional view of a main part of an electronic device using the mounting structure of FIG. 2A.

Referring to FIGS. 2A to 2C, a mounting structure 6 comprises a body 6a, the lead 6d and a threaded portion 6c. The lead 6d is insert-molded across a lower part of the body 6a, and has opposite ends extending from the body 6a and folded in the shape of the gull wing. The lead 6d is made of a material having a high tensibility such as phosphor bronze, and is suitable for surface mounting.

As in the first embodiment, the lead 6d is soldered to the lands 1c on a printed circuit board 1 simultaneously with electronic parts 3 onto the printed circuit board 1. Thereafter, the mounting structure 6 is secured to the frame 2 by inserting a screw 5 into the threaded portion 6c of the body 6a via a through-hole on the frame 2.

The mounting structure 6 of this embodiment not only offers the same advantages as those mentioned with respect to the first embodiment, but there are also advantages in the following respects.

The lead 6d is in the shape of the gull wing, and has the opposite ends thereof outwardly folded, which can provide a relatively large space between the bottom of the body 6a and the mounting surface of the printed circuit board 1. Thus, not only the printed circuit pattern 1a but also the electronic parts 3 can be mounted in this space, so more parts can be mounted on the printed circuit board 1. This can make the electronic parts more compact.

Further, since the lead 6d is made of the material having high tensibility, is in the shape of the gull wing and is relatively resilient, it can alleviate shocks or stresses which are generated by the frame 2 of the electronic parts 3 and applied to the printed circuit board 1. Thus, the mounting structure 6 is effective in preventing breakage of the printed circuit board 1, the electronic parts 3, and the connections (soldered portions) between the lands 1b of the printed circuit board 1 and the electronic parts 3. This can improve reliability of the electronic parts.

Figure 3:
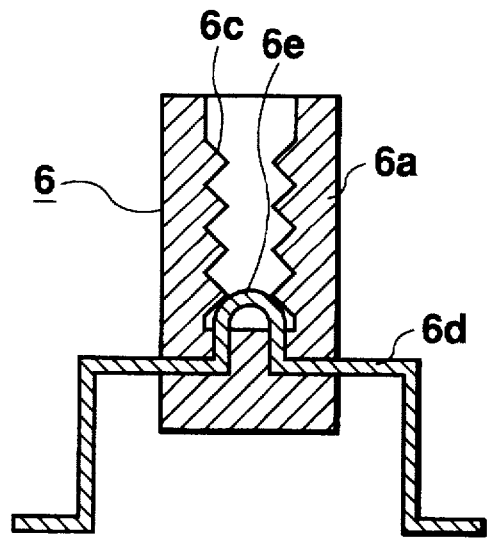
FIG. 3 is a sectional view of a mounting structure according to a third embodiment of the invention.

Embodiment 3:

A mounting structure of this embodiment is effective in reducing noise caused by electronic parts. As shown in FIG. 3, this mounting structure 6 differs from that of the second embodiment in the shape of the lead 6d. Specifically, the lead 6d has a portion 6e projecting into and exposed in the threaded portion 6c via the bottom of the threaded portion 6c. When the mounting structure 6 is secured on the printed circuit board 1, the screw 5 is received in the threaded portion 6c with its tip contacted with the exposed portion 6e of the lead 6d. The screw 5 is made of a conductive metal so as to establish an electrical connection with the lead 6d.

The lead 6d is connected to the printed circuit pattern 1a (i.e. a reference power supply wiring such as an earth potential) for supplying reference power. On the other hand, the frame 2 is jointed to the portion 6e of the lead 6d via the screw 5 so as to establish an electrical connection, thereby being entirely earthed or being connected to the reference power supply of the frame 2.

The mounting structure 6 of the third embodiment is effective in the following respects as well as the advantages attained in the second embodiment.

Once the printed circuit board 1 is secured to the frame 2 of the electronic device, the printed circuit pattern 1a, which serves as the reference power supply, and the frame 2 or the reference power supply of the frame 2 is ready for the electrical connection. In other words, when inserted into the threaded portion 6c of the mounting structure 6 via the through-hole of the frame 2, the screw 5 comes into contact with the portion 6e of the lead 6d, thereby allowing the electrical connection therebetween. Therefore, the frame 2 can absorb noise generated by the printed circuit pattern 1a, via the mounting structure 6, so it is possible to suppress generation of noise by the electronic parts (i.e. it is possible to reduce electro magnetic radiation).

Further, the mounting structure 6 functions also as a route for absorbing the noise, which enables the electronic parts to reduce the noise in a simple and economic manner.

Embodiment 4:

A mounting structure 6 is as effective in reducing noise generated by the electronic parts as the mounting structure 6 of the third embodiment.

Figure 4:
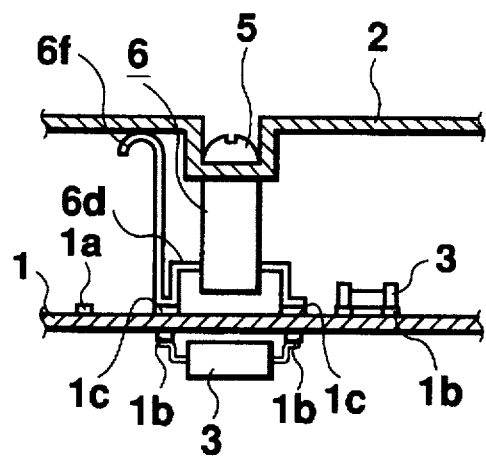
FIG. 4 is a sectional view of a main part of an electronic device using a mounting structure according to a fourth embodiment.

Referring to FIG. 4, a lead 6d is in the shape of the gull wing, and has an extension 6f which is formed by folding one end thereof in the shape of an inverted letter J. The lead 6d and the extension 6f are obtained by patterning one plate, i.e. they are integral. The extension 6f is resilient at its rounded portion. When the printed circuit board 1 is secured to the frame 2, the rounded portion of the extension lead 6f comes into contact with the frame 2 (i.e. the reference power supply formed on the frame 2), thereby allowing an electrical connection between the extension 6f and the frame 2.

The mounting structure 6 of this embodiment is as effective as the mounting structure 6 of the third embodiment, but is also advantageous in the following respects.

When the printed circuit board 1 is mounted on the frame 2, the printed pattern 1a, serving as the reference power supply for the printed circuit board 1, and the frame 2 or the reference power supply of the frame 2 are joined for the electrical connection. Specifically, when the screw 5 is inserted into the threaded portion 6c (of the mounting structure 6) via the through-hole (of the frame 2), the printed circuit board 1 is secured to the frame 2. Simultaneously, the tip of the extension 6f of the lead 6d is joined to the frame 2 or the reference power supply of the frame 2 so as to establish the electrical connection. As described above, the extension 6f is integral with the lead 6d, which is joined to the lands 1c of the printed circuit board 1 so as to establish the electrical connection. Thus, noise generated by the printed circuit pattern 1a can be absorbed by the frame 2 or by the reference power supply of the frame 2, thereby protecting the electronic device against noise.

Further, the extension 6f of the lead 6d functions to absorb noise, thereby protecting the electronic device against noise and realizing the electronic device at a reduced cost.

Embodiment 5:

A mounting structure of this embodiment is as effective in reducing noise caused by the electronic device as the mounting structures in the third and fourth embodiments, and is characterized by its simplified configuration.

In this embodiment, the body 6a shown in FIGS. 1A to 1C or the body 6a of FIGS. 2A to 2C is made of a conductive material such as metal or the like. The body 6a and the lead 6b are joined for an electrical connection. The lead 6b is connected to the lands 1c of the printed circuit board 1, and the body 6a is secured to the frame 2 by the screw 5 received in the threaded portion 6c. Thus, the body 6s itself serves as a route for absorbing noise.

The mounting structure 6 of this embodiment is as effective as those in the third and fourth embodiments, and is also advantageous in the following respects.

Being conductive, the mounting structure 6 obviates the portion 6e and the extension 6f which are necessary in the mounting structure 6 of the embodiment 3. Thus, the mounting structure 6 can be simplified, and effectively suppress noise.

Embodiment 6:

In this embodiment, a mounting structure 6 substantially differs from those of the first to fifth embodiments.

Figure 5A:
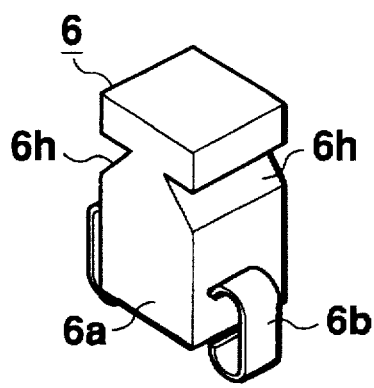
Fig. 5A is a perspective view of a mounting structure according to a six embodiment of the invention.
Figure 5C:
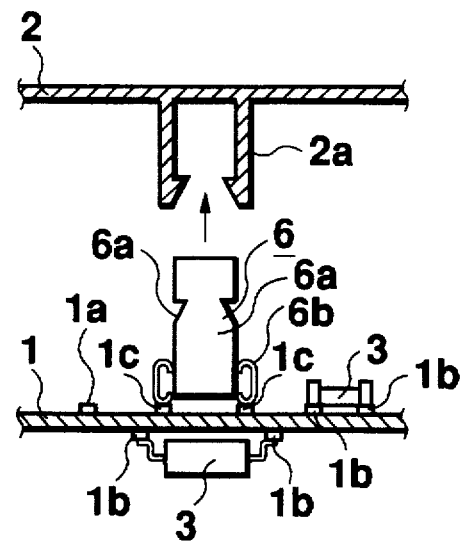
FIG. 5C is a sectional view of the electronic device, showing a second step of incorporating the electronic parts thereinto.
Figure 5B:
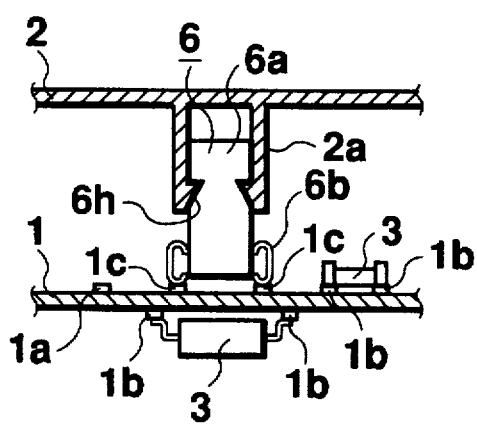
FIG. 5B is a sectional view of a main part of an electronic device using the mounting structure of FIG. 2A, showing a first step of incorporating electronic parts into the electronic device using the mounting structure.

Referring to Figs. 5A and 5B, the mounting structure 6 comprises a body 6a having a pair of notches 6h on a substantially upper part thereof. The frame 2 has a clip 2a at a position on which the mounting structure 6 is gripped at the notches 6h thereof. The clip 2a is sufficiently resilient to hold the body 6a of the mounting structure 6, i.e. folded tips of the clip 2a come into engagement with the notches 6h of the body 6a. The clip 2a is freely engageable with and disengageable from the notches 6h of the body 6a.

The mounting structure 6 is secured to the printed circuit board 1 with the lead 6b soldered to the lands 1c of the printed circuit board (refer to FIG. 5C) when the electronic parts 3 are mounted thereon.

Figure 5D:
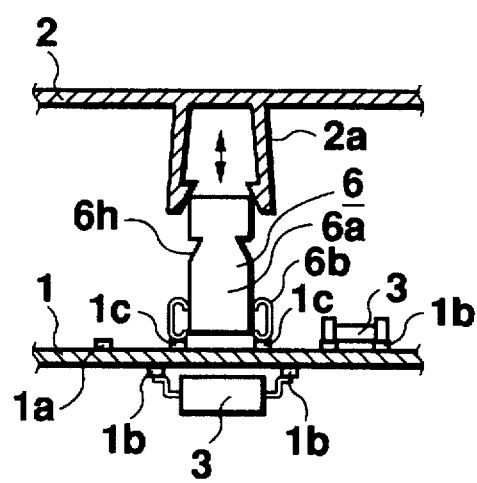
Fig. 5D is a sectional view of the electronic device, showing a third step of incorporating the electronic parts thereinto.

Thereafter, the clip 2a is widened by the top of the mounting structure 6 which is pushed upward into a space of the clip 2a, as shown in Figs. 5C and 5D. The clip 2a is engaged with the notches 6h of the body 6a, thereby causing the body 6a to be joined to the frame 2. Thus, the printed circuit board 1 is secured to the frame 2 via the mounting structure 6.

When the clip 2a is forcibly widened, the body 6a can be disengaged from the frame 2, thereby enabling the printed circuit board 1 to be detached from the frame 2.

This mounting structure 6 is as effective as that of the first embodiment, and is also advantageous in the following respects.

The mounting structure 6 can be easily attached to and detached from the clip 2a of the frame 2, as desired. The printed circuit board 1 can be attached to or detached from the frame 2 without using a screw 5 and a tool such as a screw driver, which can simplify and facilitate assembly and maintenance of the electronic device.

Further, the clip 2a is integral with the frame 2, and the notches 6h are simply made on the surface of the body 6a of the mounting structure 6. Therefore, the number of electronic parts can be reduced due to the absence of the screw 5.

Figure 6A:
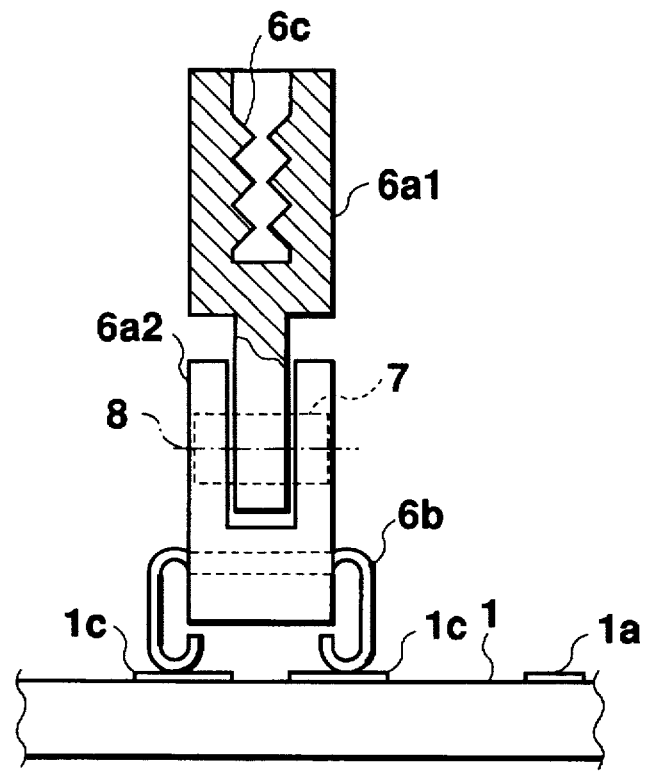
Fig. 6A is a partial sectional view of a mounting structure according to a seventh embodiment, and a printed circuit board.
Figure 6B:
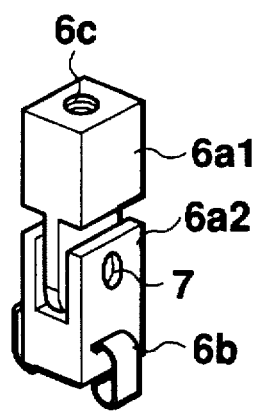
FIG. 6B is a perspective view of the mounting structure of Fig. 6A.

Embodiment 7:

A mounting structure 6 includes a two-piece body 6a, which has an upper body 6a1 and a lower body 6a2, as shown in FIGS. 6A and 6B. The upper body 6a1 has a threaded portion 6c, which is similar to that of the first embodiment. The lower body 6a2 has a J-bend type lead 6b, which is insert-molded therein. The lead 6b is soldered to the lands 1c of the printed circuit board 1. The upper body 6a1 has a projecting part, which is received in a hollow area of the lower body 6a2, so the upper and lower bodies 6a1 and 6a2 are joined via a hinge 7.

In this embodiment, the upper body 6a1 may be secured to a liquid crystal (LCD) panel or a printed circuit board which is preferably movable with respect to the printed circuit board 1.

This mounting structure 6 is as effective as the mounting structure 6 of the first embodiment, and is also advantageous as follows.

The upper body 6a1 can be turned around the hinge 7 with respect to the lower body 6a2. The LCD panel or printed circuit board secured to the upper body 2a1 can be relatively turned with respect to the printed circuit board 1 secured to the lower body 6a2. For instance, the LCD panel can be mounted at a desired angle so as to enhance its visibility. Further, a plurality of printed circuit boards can be stuck in the electronic device, which increases a packing density. Further, when at least two printed circuit boards are superimposed, they can be maintained or repaired by opening a space therebetween. It is possible to check a mounted or soldered state of the electronic device, or a state of the printed circuit pattern 1a.

The mounting structure 6 may include a clutch or friction mechanism to be added between the upper and lower bodies 6a1 and 6a2, or a mechanism for holding the upper body 6a1 against the lower body 6a2 at a desired angle.

Embodiment 8:

In this embodiment, a mounting structure 6 differs from the mounting structure 6 of the first embodiment in positions of the threaded portion 6c and the leads 6b.

Figure 7A:
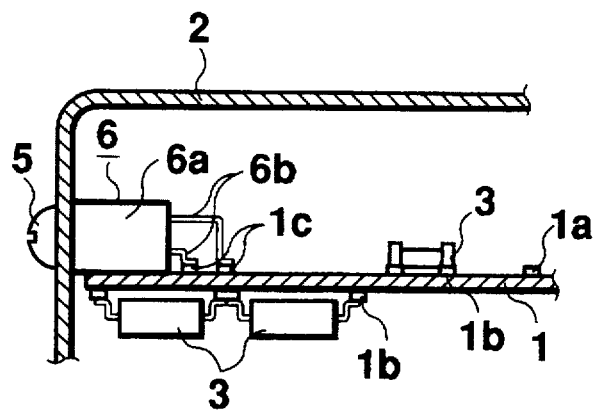
FIG. 7A is a sectional view of an electronic device with electronic parts mounted using a mounting structure according to an eighth embodiment.
Figure 7B:
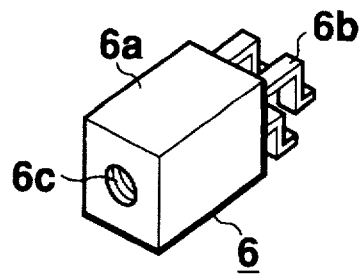
FIG. 7B is a perspective view of the mounting structure of FIG. 7A.

Referring to FIGS. 7A and 7B, the mounting structure 6 is of a horizontal type, and has the threaded portion 6c on a side thereof, and the leads 6b on the side opposite to the threaded portion 6c. A screw is inserted into the threaded portion 6c via a through-hole (not shown) on the frame 2, so a printed circuit board 1 is secured to the frame 2 via the mounting structure 6. The leads 6b are in the shape of the gull wing, and are arranged in two tiers.

Figure 7C:
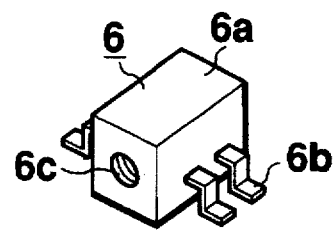
FIG. 7C is a perspective view of a modification of the mounting structure of FIG. 7A.

FIG. 7C shows a mounting structure 6 which is a modification of the foregoing mounting structure 6. In this case, two leads 6b are arranged across two sides of the main body 6a, which are orthogonal to the side where the threaded portion 6c is formed. The leads 6b are of a dual-in-line type.

The mounting structures 6 of the eighth embodiment are as effective as that of the first embodiment, and are also advantageous in the following respects.

It is possible to secure the printed circuit board 1 on a vertical side of the frame 2 using the mounting structure 6. Thus, other printed circuit boards 1 can be secured on the upper horizontal part of the frame using any of the mounting structures in the first to sixth embodiments. The mounting structures can be selected in accordance with the position of the frame 2 where the electronic parts are secured.

Figure 8A:
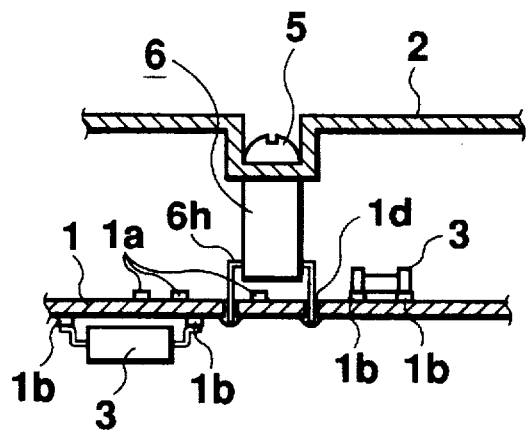
FIG. 8A is a sectional view of an electronic device with electronic parts mounted by a mounting structure according to a ninth embodiment.
Figure 8B:
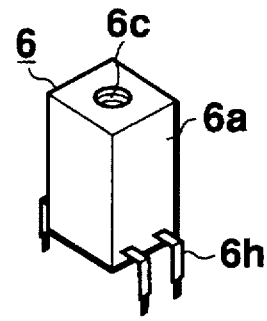
FIG. 8B is a perspective view of the mounting structure of FIG. 8A.
Figure 9:
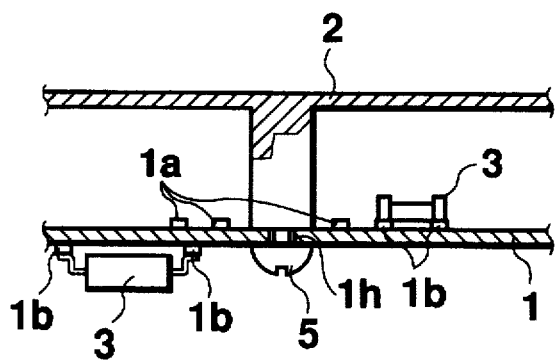
FIG. 9 is a sectional view of a conventional structure for mounting an electronic device.

Embodiment 9:

Referring to FIGS. 8A and 8B, a mounting structure 6 includes pin-inserting type leads 6h, and differs from the mounting structure 6 of the first embodiment in this respect. A printed circuit board 1 has holes 1d into which the leads 6h are inserted. The leads 6h inserted into the holes 1d are soldered to the printed circuit board 1, and are secured thereon with a strong mechanical force. In other words, the mounting structure 6 is strongly secured to the printed circuit board 1. This prevents the soldered portion from being cracked, and increases the reliability of the connection between the leads h and the printed circuit board 1.

The through-holes 1d have a diameter which permits the leads 6h to be inserted, and is much smaller than the through-hole for passing the screw 5. According to this embodiment, the printed circuit board 1 can maintain its packaging density even when it has the holes 1d.

The mounting structure 6 of this embodiment is also efficiently secured on the printed circuit board 1 in the same process as that for mounting the electronic parts 3 thereon.

What is claimed is:

1. A mounting structure for receiving a screw to mount a printed circuit board to a frame of an electronic device, comprising:
   (a) a body;
   (b) a threaded portion formed on a side of the body corresponding to the frame, the threaded portion receiving the screw for securing the body to the frame; and
   (c) at least one lead disposed on the body and extending from the body to the printed circuit board, the lead being soldered to lands on a mounting surface of the printed circuit board, the lead supporting the body away from the mounting surface to define a space between the body of the mounting structure and the mounting surface of the printed circuit board.

2. The mounting structure as in claim 1, wherein the lead is in the shape of a gull wing, having a length.

3. The mounting structure as in claim 2, wherein the lead is made of a material having a high tensibility.

4. The mounting structure as in claim 1, wherein the lead has an extension which electrically connects with the frame, and the extension extends between lands of the printed circuit board and the frame.

5. The mounting structure of claim 4 wherein the frame contacting end of the lead extension is formed in the shape of an inverted letter J and is resilient so as to provide continuous electrically conductive path from the printed circuit board to the frame.

6. The mounting structure as in claim 1, wherein the body includes two members, one member including the threaded portion and another member having the lead disposed thereon, and the two members are hingedly connected.

7. The mounting structure as in claim 6 wherein the hinge contains a friction mechanism which generates sufficient friction to hold the two members of the body at a desired angle except when moved by an operator.

8. The mounting structure as in claim 1, wherein the lead is disposed on one side of the body, and the threaded portion is formed from a top of the body to an area near the bottom of the body.

9. The mounting structure as in claim 1, wherein the lead is disposed on one side of the body, and the threaded portion is present on a side opposite to the lead.

10. The mounting structure as in claim 1, wherein the lead is of a surface mounting type.

11. The mounting structure as in claim 1, wherein the lead is of a pin-insert type.

12. The mounting structure as in claim 1 wherein the end of the lead furthest from the body is formed in the shape of a J-bend and extends from said sides of said body and attaches to said printed circuit board so as to define a space between the body of the mounting structure and the mounting surface of the printed circuit board.

13. The mounting structure of claim 1 wherein the lead is selected from the group comprising dual-in-line types, surface mount types, and pin insert types; and wherein said lead is resilient, thereby absorbing mechanical shocks which are generated between the frame and the printed circuit board.

14. The mounting structure of claim 13 wherein the printed circuit board has an edge defining a hole for receiving leads of said pin inserting type.

15. The mounting structure of one of claims 2 and 12, wherein the space defined between the body of the mounting structure and the mounting surface of the printed circuit board is a large enough space so as to allow the mounting of electronic parts between the body and surface of the printed circuit board.

16. A mounting structure for receiving a screw to mount a printed circuit board to a frame of an electronic device, comprising:
   (a) a body;
   (b) a threaded portion formed on a side of the body corresponding to the frame, the threaded portion receiving the screw for securing the body to the frame; and
   (c) at least one lead disposed on the body and extending from the body to the printed circuit board, the lead being soldered to lands on a mounting surface of the printed circuit board;
   wherein the body is made of a conductive material, the lead is insert-molded in the body, the body is joined, for electrical connection, to the frame using a conductive screw inserted into the threaded portion, and the lead is joined to a land connected to a reference power supply of the printed circuit board for electrical connection therewith.

17. A mounting structure for receiving a screw to mount a printed circuit board to a frame of an electronic device, comprising:
   (a) a body;
   (b) a threaded portion formed on a side of the body corresponding to the frame, the threaded portion receiving the screw for securing the body to the frame; and
   (c) at least one lead disposed on the body and extending from the body to the printed circuit board, the lead being soldered to lands on a mounting surface of the printed circuit board;
   wherein the lead is insert-molded in the body, has a portion exposed in the threaded portion of the body, is partially connected to the frame by a conductive screw inserted in the threaded portion, and is connected to a land connected to a reference power supply of the electronic device.

18. A mounting structure for mounting a printed circuit board to a frame comprising:
   (a) a body adapted to be secured to the frame, having a frame end and a printed circuit board end;
   (b) a lead disposed on said body, extending from said body to said printed circuit board; and
   a threaded portion for receiving a screw on said frame end of said body for securing said body to said frame; and wherein said frame is electrically conductive and said body is electrically conductive and said lead is electrically conductive and wherein the lead electrically contacts the printed circuit board so as to define an electrically conductive path from the printed circuit board through said lead and said body to said frame.

19. A mounting structure for mounting a printed circuit board to a frame comprising:
   a body;
   a fastener;
   said body having a frame end and a printed circuit board end;
   said body frame end having a means for securing said fastener to said body so as to dispose said body from said frame and intermediate said frame and printed circuit board;
   at least one lead;
   means for securing said at least one lead from said printed circuit board end of said body so as to be in a position for contacting the printed circuit board, the lead supporting the body away from the printed circuit board to define a space between the body of the mounting structure and the printed circuit board.

20. The mounting structure of claim 19 wherein said fastener is a screw and said means for securing said fastener to said body is a threaded portion on said body for receiving said screw and said means for securing said at least one lead consists of soldering the lead to a surface on the printed circuit board.

21. The mounting structure of claim 19 wherein said fastener is a clip on said frame and said means for securing said fastener to said body is a notch on said body for engaging with said clip and said means for securing said at least one lead consists of soldering the lead to a surface on the printed circuit board.

22. A mounting structure for mounting a printed circuit board to a frame comprising:
   a body;
   a fastener;
   said body having a frame end and a printed circuit board end;
   said body frame end having a means for securing said fastener to said body so as to dispose said body from said frame and intermediate said frame and printed circuit board;
   at least one lead;
   means for securing said at least one lead from said printed circuit board end of said body so as to be in a position for contacting the printed circuit board;
   wherein said fastener is a screw and said means for securing said fastener to said body is a threaded portion on said body for receiving said screw and said means for securing said at least one lead consists of soldering the lead to a surface on the printed circuit board;
   wherein the screw is conductive and the lead is conductive and wherein the lead is disposed through the body and a portion of said lead is exposed in the threaded portion of said body so as to electrically contact the screw inserted in the threaded portion, so as to create an electrically conductive path between the printed circuit board and the frame.

* * * * *